United States Patent
Wu et al.

(10) Patent No.: US 7,148,425 B2
(45) Date of Patent: Dec. 12, 2006

(54) POWER PLANE SYSTEM OF HIGH-SPEED DIGITAL CIRCUIT FOR SUPPRESSING GROUND BOUNCE NOISE

(75) Inventors: Tzong-Lin Wu, Kaohsiung (TW);
Yen-Hui Lin, Kaohsiung (TW);
Sin-Ting Chen, Kaohsiung (TW);
Ting-Kuang Wang, Kaohsiung (TW)

(73) Assignee: National Sun Yat-Sen University, Kaohsiung (TW)

( * ) Notice: Subject to any disclaimer, the term of this patent is extended or adjusted under 35 U.S.C. 154(b) by 0 days.

(21) Appl. No.: 11/043,605

(22) Filed: Jan. 26, 2005

(65) Prior Publication Data

US 2005/0168238 A1    Aug. 4, 2005

(30) Foreign Application Priority Data

Jan. 29, 2004   (TW) .............................. 93101974 A

(51) Int. Cl.
*H05K 1/03*    (2006.01)
(52) U.S. Cl. ...................... 174/255; 361/794
(58) Field of Classification Search ................ 174/255, 174/260, 262; 361/792, 793, 794, 795; 333/12, 333/246, 247, 33, 181, 185
See application file for complete search history.

(56) References Cited

U.S. PATENT DOCUMENTS

| 5,736,796 | A | * | 4/1998 | Price et al. ................. 307/151 |
| 5,764,491 | A | * | 6/1998 | Tran .......................... 361/794 |
| 5,912,809 | A | * | 6/1999 | Steigerwald et al. ........ 361/780 |
| 6,822,526 | B1 | * | 11/2004 | Ryu et al. ..................... 333/12 |
| 6,965,168 | B1 | * | 11/2005 | Langhorn ................... 257/778 |

* cited by examiner

*Primary Examiner*—Ishwar (I. B.) Patel
(74) *Attorney, Agent, or Firm*—Ladas and Parry LLP

(57) ABSTRACT

The invention relates to a power plane system for suppressing ground bounce noise. The power plane system of the invention comprises a substrate, a power layer and a ground layer. The power layer comprises a plurality of metal units. There is a distance between two adjacent metal units. A plurality of bridges is used for connecting the metal units. The ground layer has a grounding metal plate. According to the invention, when the ground bounce noise occurs, the metal units can broaden the stop-band bandwidth. Therefore, the signals in the stop-band hardly are transmitted so as to suppress the ground bounce noise, and the high frequency ground bounce noise and the electromagnetic radiation can be suppressed efficiently.

8 Claims, 11 Drawing Sheets

POWER PLANE SYSTEM OF HIGH-SPEED DIGITAL CIRCUIT FOR SUPPRESSING GROUND BOUNCE NOISE

BACKGROUND OF THE INVENTION

1. Field of the Invention

The present invention relates to a power plane system of high-speed digital circuit, more particularly, a power plane system of high-speed digital circuit for suppressing ground bounce noise.

2. Description of the Related Art

The related prior art has been disclosed in U.S. Pat. Nos. 6,084,779, 6,557,154 and 6,518,930.

In high-speed digital circuit, signal line connects to the power plane, and there are parasitic inductance, capacitance and resistance. When the integrated circuit rapidly switches, a temporary voltage (ΔV) is produced between the power plane. The temporary voltage is a noise known as ground bounce noise (GBN). The resonance mode excited by the ground bounce noise causes significant signal integrity (SI) problem and electromagnetic interference (EMI) issues.

Two conventional techniques are utilized to decrease the influence of the ground bounce noise. Firstly, adding decoupling capacitors to create a low impedance path between the power and ground planes is a typical way to suppress the ground bounce noise.

Secondly, referring to FIG. 1, the conventional power plane system 10 comprises a substrate 11, a power layer 12 and a ground layer 13. The power plane 12 is formed on a first surface of the substrate 11, and the ground layer 13 is formed on a second surface of the substrate 11. The power layer 12 is a metal plate 121 having a slit 122. The slit 122 defines a region 123 to limit the ground bounce noise within the region 123. Therefore, the ground bounce noise within the region 123 does not affect the elements outside the region 123. Besides, the slit 122 is cut to decrease the area of the metal plate 121 so that the resonance frequency of electromagnetic radiation is shifted to a high frequency band, and good noise suppression and low electromagnetic radiation field in the operation frequency can be obtained.

Nevertheless, in the first conventional technique, the adding decoupling capacitor has a parasitic inductance. The more capacitance of the decoupling capacitor there is, the more parasitic inductance there is. Therefore, the suppression effect will decrease because of high parasitic inductance. In the second conventional technique, if there is no a channel 124 on the slit 122, the voltage level is cut and the signal line should cross the slit to connect with the other elements so as to cause serious signal integrity (SI) problem and electromagnetic interference (EMI) issues. It is necessary to have a channel 124 on the slit 122 to hold the voltage level and prevent signal line from crossing the slit 122. However, according to the experiment, the channel 124 will decrease the effect for suppressing noise and electromagnetic radiation and produce a new resonance frequency in the low frequency band.

Referring to FIG. 2, another conventional power plane system 20 is utilized to suppress the ground bounce noise. The conventional power plane system 20 comprises a substrate 21, a first power layer 22 and a second power layer 23. An integrated circuit 24 is disposed on the second power layer 23, and receives power from the first power layer 22. When the integrated circuit 24 rapidly switches and induces the ground bounce noise on the first power layer 24, a plurality of umbrella structures 26, 27, 28, 29 are utilized to suppress the ground bounce noise to zero. However, the umbrella structures 26, 27, 28, 29 are mounted in the substrate 21 to raise the height of the substrate and the complexity in manufacture.

Therefore, it is necessary to provide a source driver so as to solve the above problem.

SUMMARY OF THE INVENTION

One objective of the present invention is to provide a power plane system. The power plane system comprises a substrate, a power layer and a ground layer. The power layer has a plurality of metal units and a plurality of bridges. There is a distance disposed between the adjacent metal units. The bridges are used for connecting the adjacent metal units. The ground layer has a grounding metal plate.

According to the invention, when the ground bounce noise occurs, the metal units can broaden the stop-band bandwidth. Therefore, the signals in the stop-band are hardly transmitted so as to suppress the ground bounce noise, and the high frequency ground bounce noise and the electromagnetic radiation can be suppressed efficiently.

DETAILED DESCRIPTION OF THE INVENTION

Figure 1:
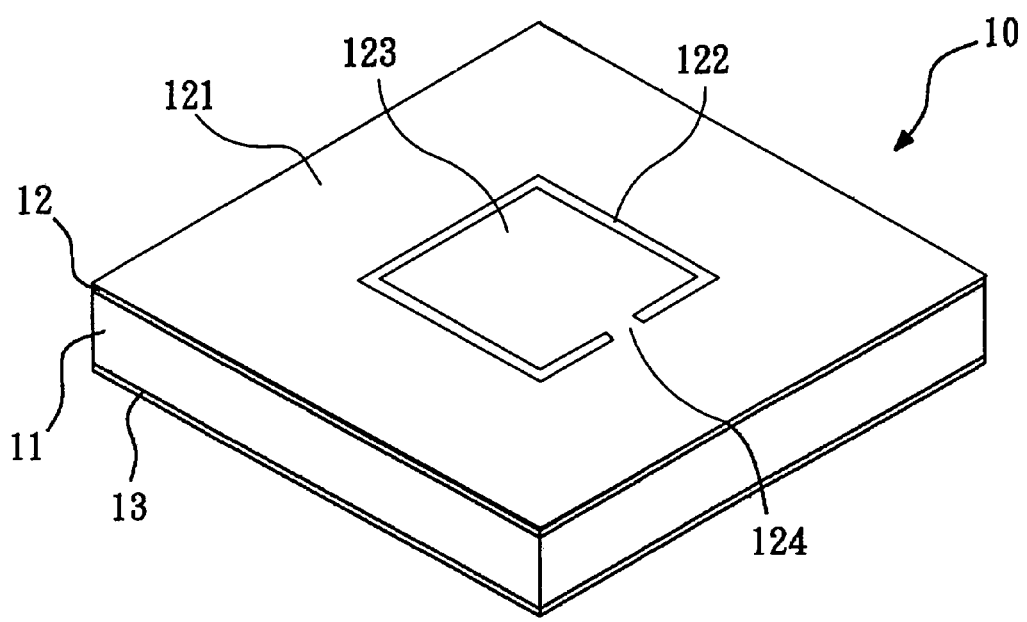
FIG. 1 shows a conventional power plane system.
Figure 2:
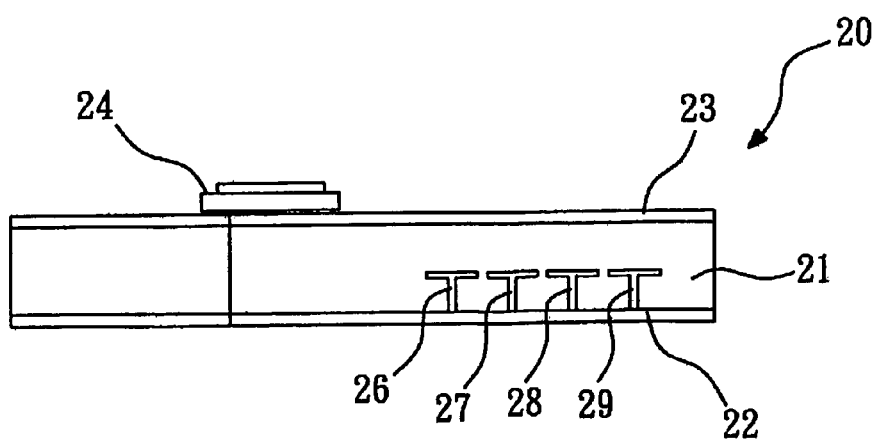
FIG. 2 shows another conventional power plane system.
Figure 3:
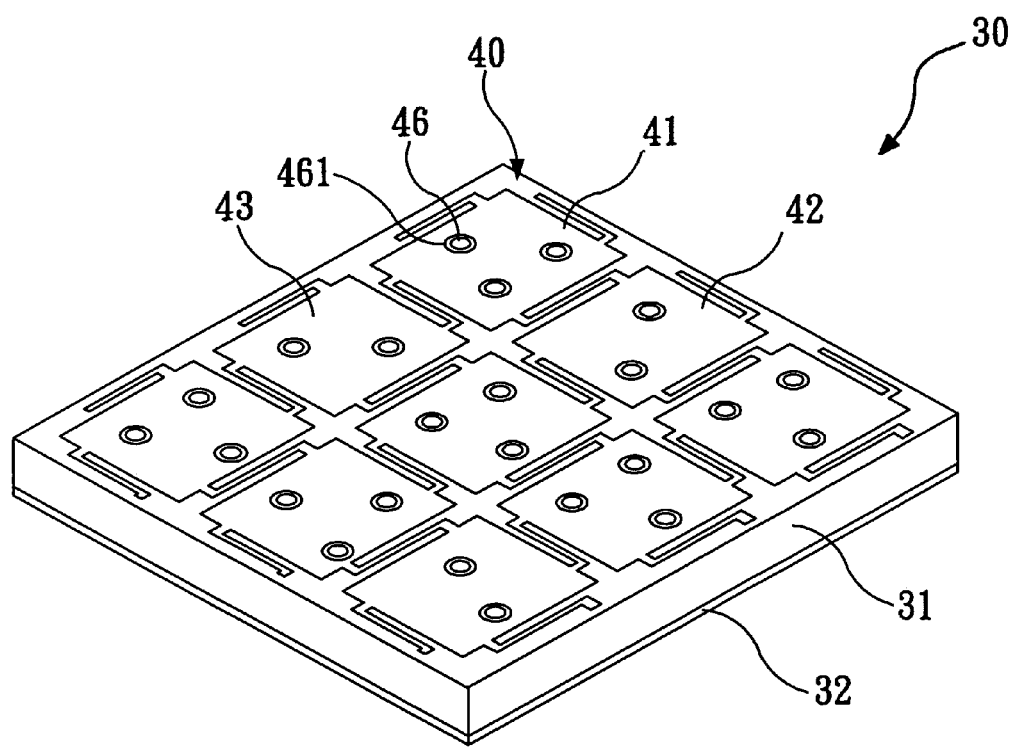
FIG. 3 shows a power plane system, according to a first embodiment of the invention.

Referring to FIG. 3, according to a first embodiment of the invention, a power plane system 30 of the invention comprises a substrate 31, a power layer 40 and a ground layer 32. The substrate 31 comprises a first surface and a second surface corresponding to the first surface. The power layer 40 is formed on the first surface of the substrate 31. The ground layer 32 is formed on the second surface of the substrate 31, and the ground layer 32 is a grounding metal plate. The power plane system of the invention can be applied to multi-layer structure, thus the power layer and the ground layer are not limited to be formed on the same structure and can be formed on different substrates.

The substrate may be a printed circuit board to apply the power plane system of the invention to multi-layer printed circuit board structure. Besides, the substrate may be a semiconductor packaging substrate to apply the power plane system of the invention to multi-layer semiconductor packaging structure. Furthermore, the substrate may be a low temperature co-fired ceramics substrate.

Figure 4:
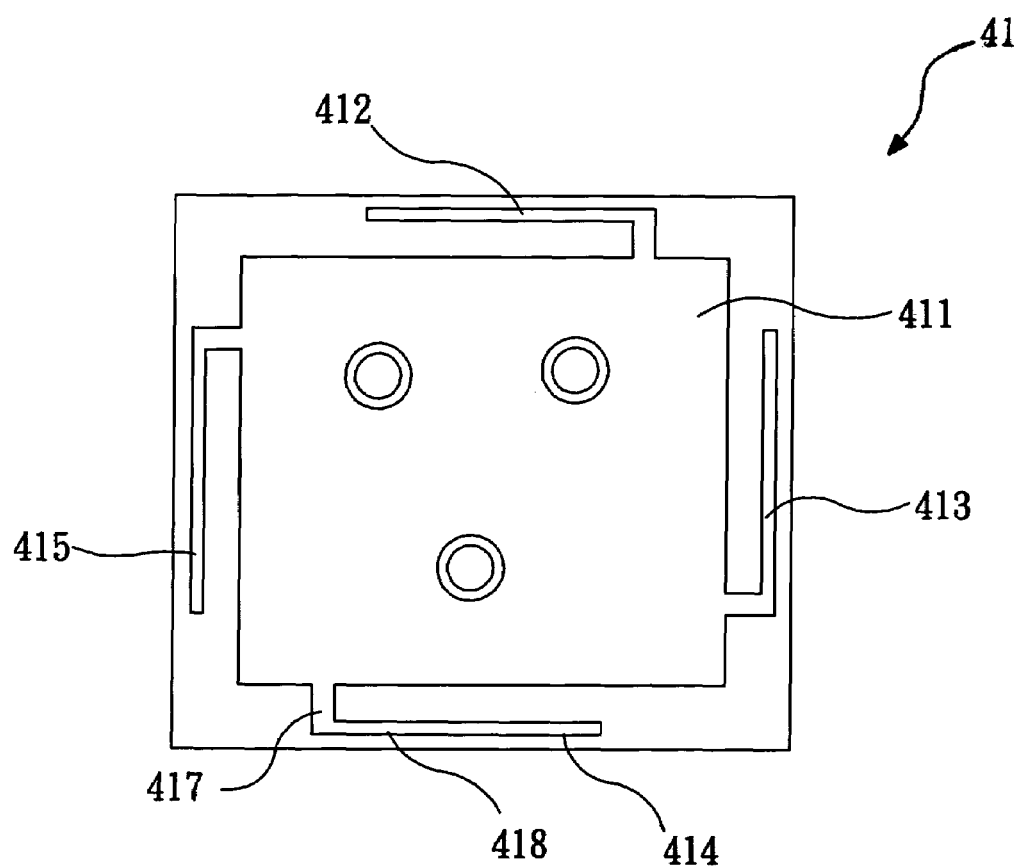
FIG. 4 shows a metal unit, according to the first embodiment of the invention.

The power layer 40 has a plurality of metal units 41, 42, 43. There is a distance disposed between the adjacent metal units. For example, a distance is spaced between the adjacent metal units 41 and 42. The adjacent metal units are connected by a plurality of bridges. Referring to FIG. 4, the metal unit 41 is taken as an example for illustration. The metal unit 41 comprises a metal unit plate 411 and a plurality of bridges 412, 413, 414, 415. The bridges 412, 413, 414, 415 are used for electrically connecting the metal unit 41 and the adjacent metal units. For example, the bridge 413 of the metal unit 41 connects to a bridge of the metal unit 42 so that the metal unit 41 electrically connects to the metal unit 42.

Each of the bridges 412, 413, 414, 415 comprises a plurality of fold sections. For example, the bridge 414 comprises two fold sections 417 and 418. The two fold sections 417, 418 are connected vertically, and are formed in an L shape.

According to the first embodiment of the invention, the metal unit is square, and the L-shape bridges are utilized to connect the adjacent metal units. However, the metal unit of the invention does not restrict to the square, and the metal unit may be hexagon or the other shape that can be continuously disposed. The metal unit of the invention may be an irregular shape, and there is a distance between the adjacent metal units and the bridges are used to connect the adjacent metal units.

In view of equivalent circuit, the bridges (for example, the bridge 413) connect the adjacent metal units, and the bridges can be equivalent to be an inductor. The adjacent metal units (for example, the metal units 41 and 42) having a distance can be equivalent to be a capacitor. Besides, the metal unit, the substrate and the ground layer can be equivalent to be another capacitor, and two capacitors can be combined into an equivalent capacitor. The equivalent inductor and the combined equivalent capacitor are utilized to obtain a broad stop-band bandwidth. Therefore, the signals in the stop-band are hardly transmitted so as to suppress the ground bounce noise, and the high frequency ground bounce noise and the electromagnetic radiation can be suppressed efficiently.

In multi-layer structure, except for the power plane system, the multi-layer structure further comprises one element layer or a plurality of element layers. The element layer comprises a substrate and a plurality of elements (for example, the integrated circuits). The metal units of the power plane system are designed to supply power to certain integrated circuits. When someone integrated circuit rapidly switches and occurs the ground bounce noise, the ground bounce noise is limited in the metal unit and cannot be transmitted to the outside of the metal unit. Therefore, the ground bounce noise cannot affect the other element outside the metal unit. The power plane system of the invention can suppress the ground bounce noise.

Furthermore, each metal unit comprises a plurality of penetrating holes. The penetrating holes are isolated from the metal units so as to provide signal connection with the element layers. For example, the metal unit 41 has a plurality of penetrating holes 46. An isolated ring 461 is disposed between the penetrating hole 46 and the metal unit 41 so as to isolate the penetrating hole 46 and the metal unit 41.

Figure 5:
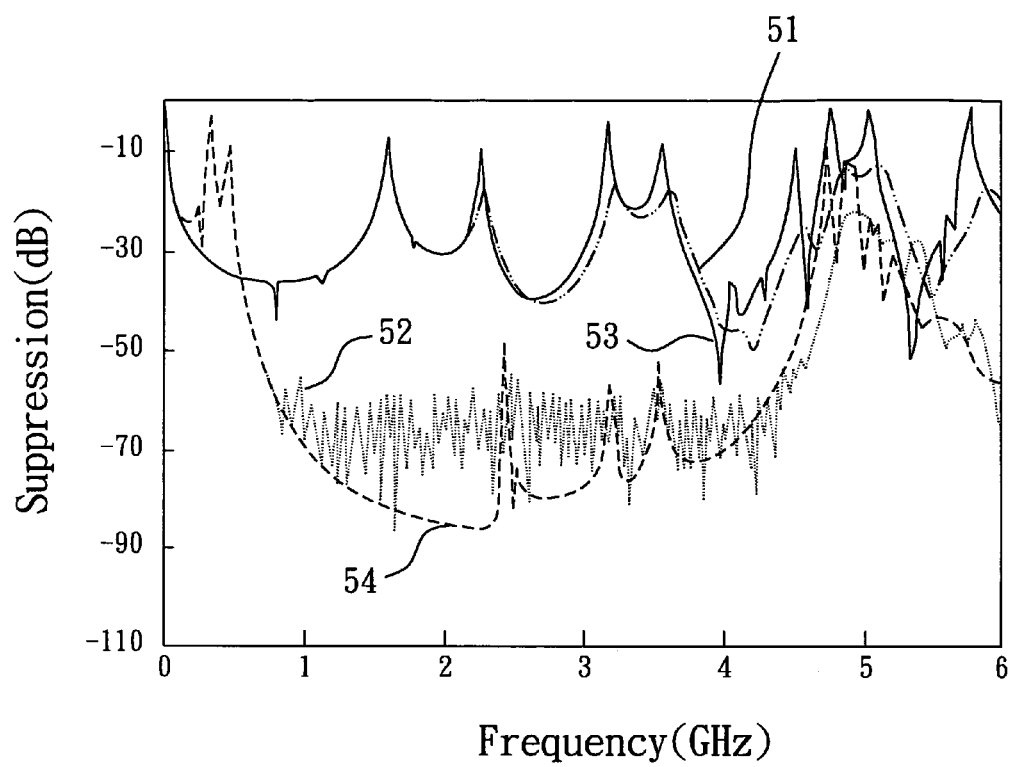
FIG. 5 shows frequency responses of the reference board and the power plane system, according to the first embodiment of the invention.

Referring to FIG. 5, a first curve 51 is the measured frequency response of a reference board, and a second curve 52 is the measured frequency response from the metal unit 43 to the metal unit 41 according to the power plane system of the invention. Besides, by utilizing the HFSS simulation software, a third curve 53 is the simulated frequency response of a reference board, and a fourth curve 54 is the simulated frequency response from the metal unit 43 to the metal unit 41 according to the power plane system of the invention. The above reference board does not have any bridges on the power layer. Therefore, by measure and simulation, as a result, the power plane system of the invention has a stop-band with 60 dB from 600 MHz to 4.6 GHz. If the noise is within the stop-band, the noise cannot be easily transmitted to the other elements. The reference board without bridges does not have the characteristics as described above, and the noise can be easily transmitted to the other elements. Besides, according to the power plane system of the invention, the stop-band is 600 MHz–4.6 GHz, and the bandwidth of the stop-band is 4 GHz.

Figure 6:
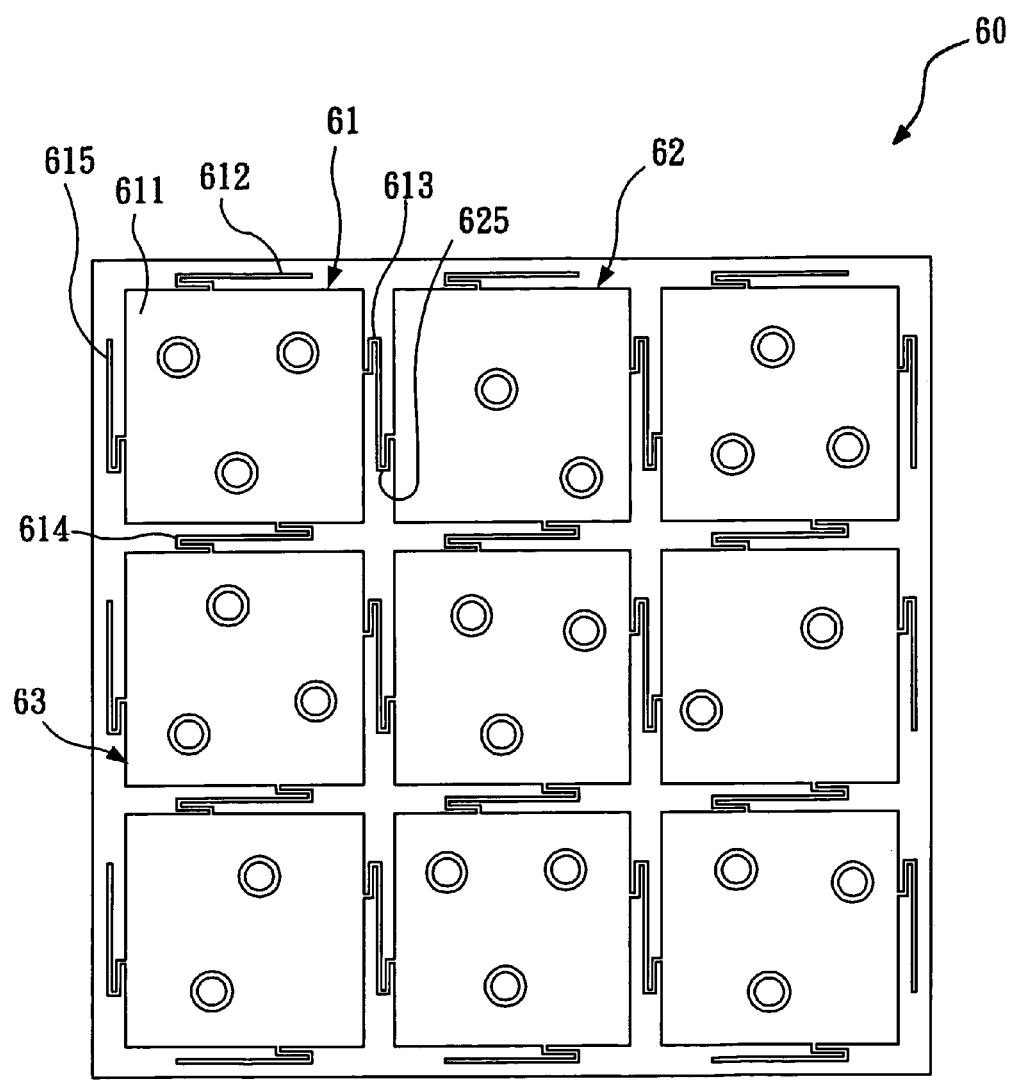
FIG. 6 shows a power layer of a power plane system, according to a second embodiment of the invention.

Referring to FIG. 6, according to a second embodiment of the invention, it shows a power layer 60 of a power plane system of the invention. Similarly, the power layer 60 has a plurality of metal units 61, 62, 63. However, the difference between the power layer 60 of the second embodiment and the power layer 40 of the first embodiment is the shape of bridges. The metal unit 61 is taken as an example for illustration. The metal unit 61 comprises a metal unit plate 611 and a plurality of bridges 612, 613, 614, 615. The bridges 612, 613, 614, 615 are used for electrically connecting the metal unit 61 and the adjacent metal units. For example, the bridge 613 of the metal unit 61 connects to a bridge 625 of the metal unit 62 so that the metal unit 61 electrically connects to the metal unit 62.

Each of the bridges 612, 613, 614, 615 comprises a plurality of fold sections. For example, the bridge 615 comprises four fold sections. The four fold sections are connected vertically and continuously.

Figure 7:
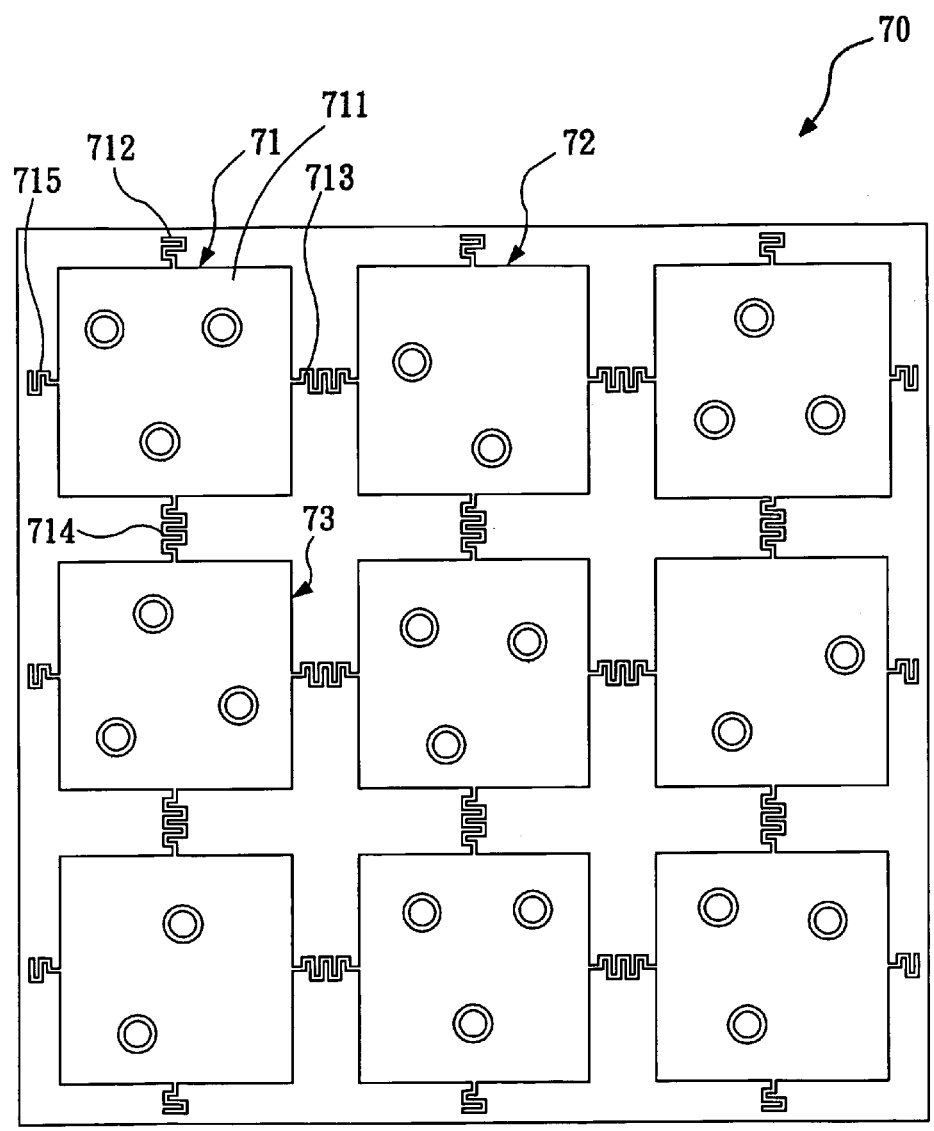
FIG. 7 shows a power layer of a power plane system, according to a third embodiment of the invention.

Referring to FIG. 7, according to a third embodiment of the invention, it shows a power layer 70 of a power plane system of the invention. Similarly, the difference between the power layer 70 of the third embodiment and the power layer 40 of the first embodiment is the shape of bridges. The power layer 70 has a plurality of metal units 71, 72, 73. The metal unit 71 is taken as an example for illustration. The metal unit 71 comprises a metal unit plate 711 and a plurality of bridges 712, 713, 714, 715. Each of the bridges 712, 713, 714, 715 comprises a plurality of fold sections. For example, the bridge 714 comprises seven fold sections. The seven fold sections are connected vertically and continuously. The power plane systems of the second embodiment and the third embodiment of the invention can suppress the ground bounce noise.

Figure 8:
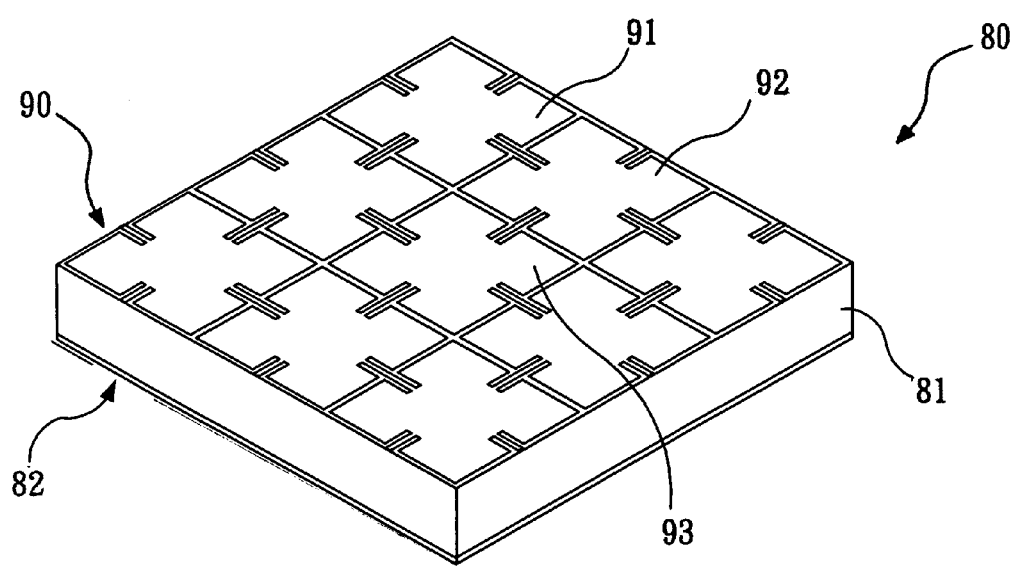
FIG. 8 shows a power plane system, according to a fourth embodiment of the invention.

Referring to FIG. 8, according to a fourth embodiment of the invention, a power plane system 80 of the invention comprises a substrate 81, a power layer 90 and a ground layer 82. The substrate 81 comprises a first surface and a second surface corresponding to the first surface. The power layer 90 is formed on the first surface of the substrate 81. The ground layer 82 is formed on the second surface of the substrate 81, and the ground layer 82 is a grounding metal plate.

Figure 9:
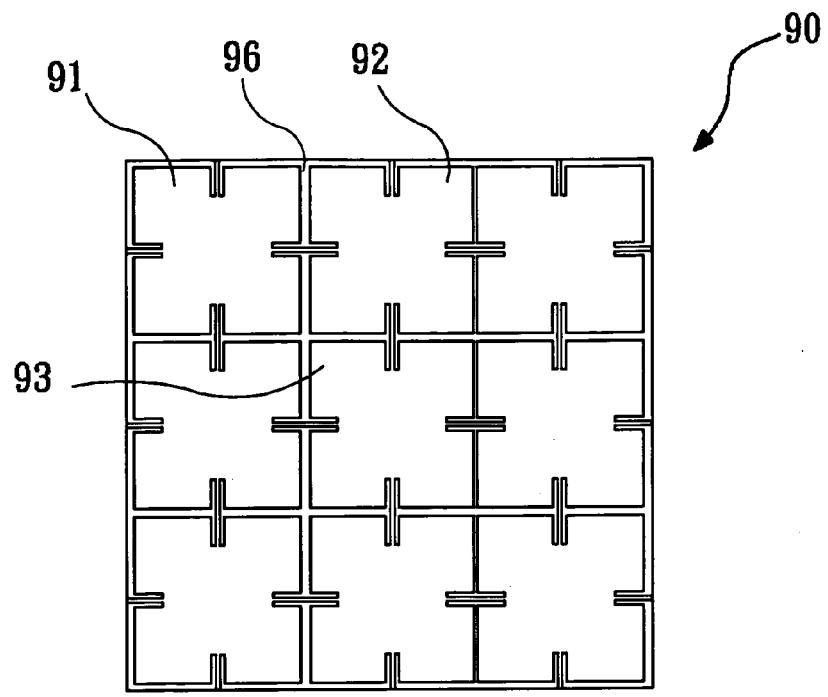
FIG. 9 shows a power layer of the power plane system, according to the fourth embodiment of the invention.
Figure 10:
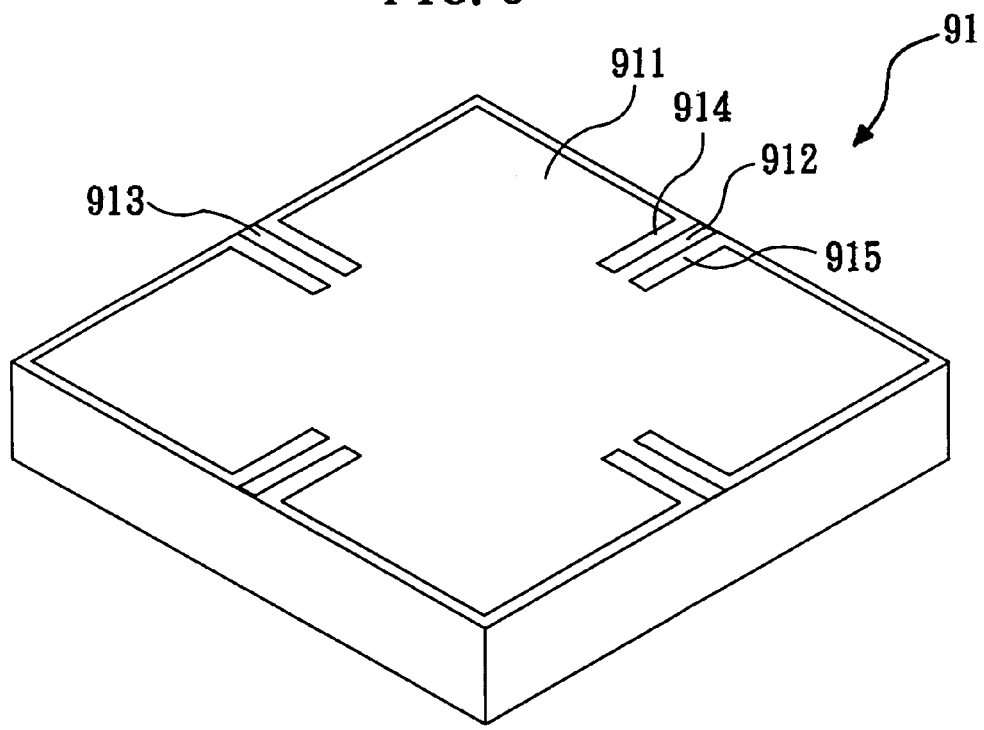
FIG. 10 shows a metal unit of the power plane system, according to the fourth embodiment of the invention.

Referring to FIG. 9, the power layer 90 has a plurality of metal units 91, 92, 93 and a plurality of unit slits 96. The unit slit is spaced apart the adjacent metal units. For example, the unit slit 96 is spaced apart the adjacent metal units 91 and 92. Referring to FIG. 10, the metal unit 91 is taken as an example for illustration. The metal unit 91 comprises a metal unit plate 911 and a plurality of channels 912, 913. The channels 912, 913 are used for electrically connecting the metal unit 91 and the adjacent metal units. For example, the channel 912 of the metal unit 91 electrically connects the metal unit 91 and the metal unit 92. Each of the channels 912, 913 is defined by a plurality of channel slits. For example, the channel 912 is defined by two channel slits 914 and 915 disposed in a pair form. The channel slits 914, 915 extend from the unit slits 96 into the metal unit plate 911 to form the channel 912.

In view of equivalent circuit, the channels (for example, the channel 912) connect the adjacent metal units, and the channels can be equivalent to be an inductor. The adjacent metal units (for example, the metal units 91 and 92) having a unit slit (for example, the unit slit 96) can be equivalent to be a capacitor. Besides, the metal unit, the substrate and the ground layer can be equivalent to be another capacitor, and the two capacitors can be combined into an equivalent capacitor. The equivalent inductor and the combined equivalent capacitor are utilized to obtain a broad stop-band bandwidth. Therefore, the signals in the stop-band are hardly transmitted so as to suppress the ground bounce noise, and the high frequency ground bounce noise and the electromagnetic radiation can be suppressed efficiently.

Figure 11:
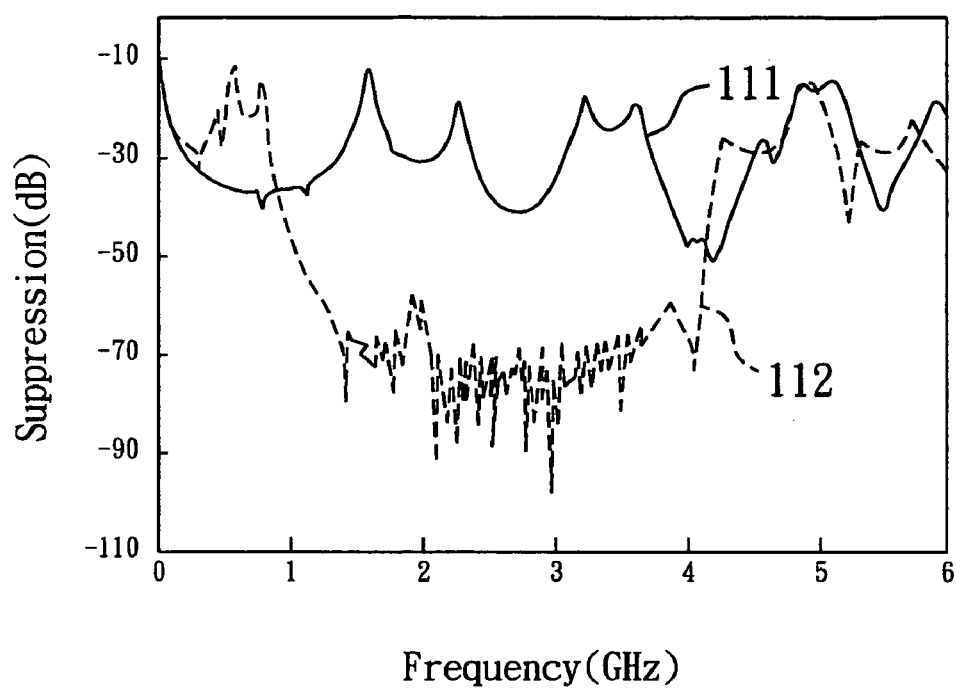
FIG. 11 shows frequency responses of the reference board and the power plane system, according to the fourth embodiment of the invention.

Referring to FIG. 11, a first curve 111 is the frequency response of a reference board, and a second curve 112 is the frequency response from the metal unit 93 to the metal unit 91 according to the power plane system of the fourth embodiment of the invention. The above reference board does not have any unit slits on the power layer. Therefore, as a result, the power plane system of the invention has a stop-band from 1 GHz to 4 GHz. If the noise is within the stop-band, the noise cannot be easily transmitted to the other elements. The reference board without unit slits does not have the characteristics as described above, and the noise can be easily transmitted to the other elements.

Figure 12:
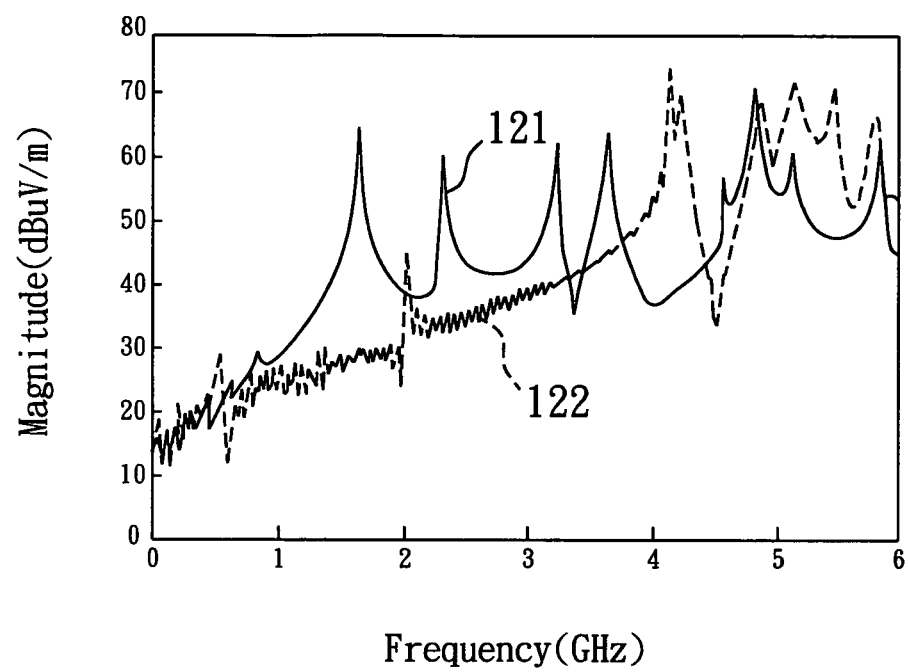
FIG. 12 shows radiation responses of the reference board and the power plane system, according to the fourth embodiment of the invention.

Referring to FIG. 12, the ground bounce noise suppression behavior for the power plane system of the fourth embodiment is investigated in time domain by FDTD method. Wherein, a first curve 121 is the radiation response of a reference board, and a second curve 122 is the radiation response according to the power plane system of the fourth embodiment. Therefore, as a result, the power plane system of the invention has relative low radiation within the stop-band from 1 GHz to 4 GHz. The low radiation and high suppression of the ground bounce noise for the power plane system of the invention can be proven.

Figure 13:
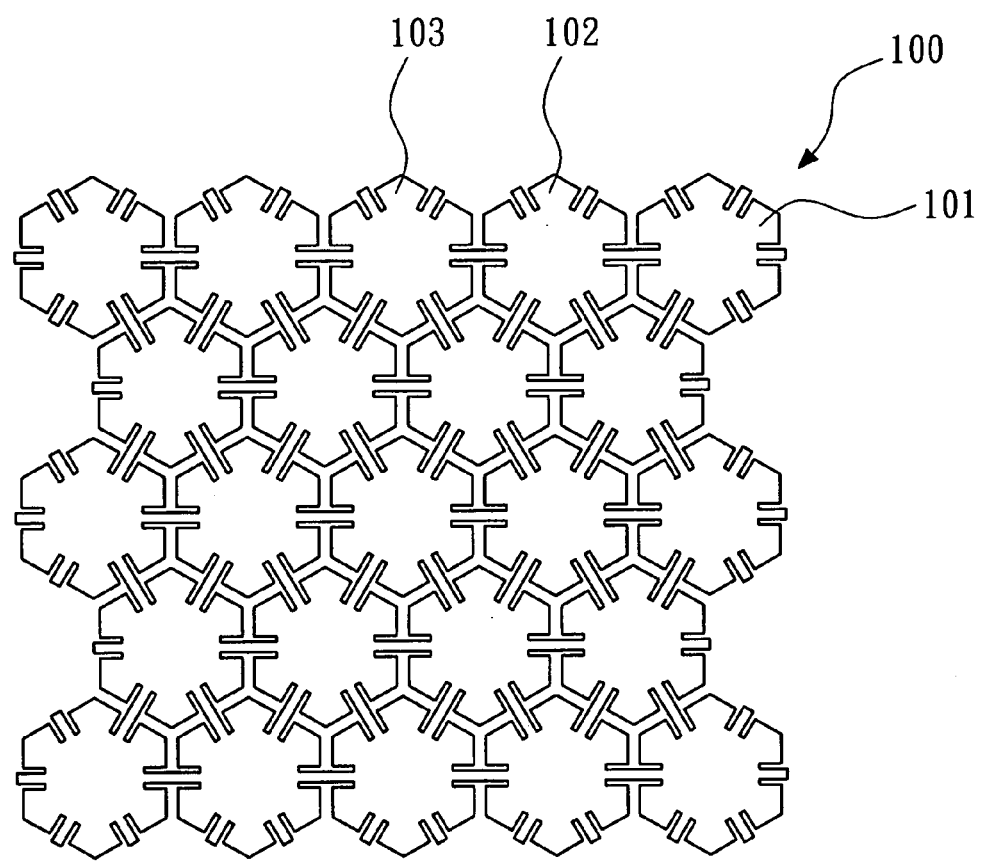
FIG. 13 shows the power plane system with hexagonal metal units.

FIG. 13 shows another power layer 100 of the present invention. The power layer 100 comprises a plurality of metal units 101, 102, 103 that are hexagons.

While an embodiment of the present invention has been illustrated and described, various modifications and improvements can be made by those skilled in the art. The embodiment of the present invention is therefore described in an illustrative, but not restrictive, sense. It is intended that the present invention may not be limited to the particular forms as illustrated, and that all modifications which maintain the spirit and scope of the present invention are within the scope as defined in the appended claims.

What is claimed is:

1. A power plane system, comprising:
    a substrate;
    a power layer, having a plurality of metal units and a plurality of bridges, a distance disposed between the adjacent metal units, the bridges used for connecting the adjacent metal units, the distance being a unit slit, the bridge being a channel, the unit slits disposed between the adjacent units, and each channel defined by a plurality of channel slits; and
    a ground layer, having a grounding metal plate,
    wherein, the substrate comprises a first surface and a second surface corresponding to the first surface, the power layer is formed on the first surface of the substrate, and the ground layer is formed on the second surface of the substrate.

2. The power plane system according to claim 1, wherein two channel slits are disposed in a pair form to define one channel.

3. The power plane system according to claim 2, wherein the metal unit is a square.

4. The power plane system according to claim 1, wherein the channel slits extend from the unit slits into the metal units.

5. The power plane system according to claim 1, wherein the metal unit is a hexagon.

6. The power plane system according to claim 1, wherein the substrate is a printed circuit board.

7. The power plane system according to claim 1, wherein the substrate is a semiconductor packaging substrate.

8. The power plane system according to claim 1, wherein the substrate is a low temperature co-fired ceramics substrate.

* * * * *